United States Patent [19]

Sproull

[11] Patent Number: 4,542,106
[45] Date of Patent: Sep. 17, 1985

[54] FIBER GLASS COMPOSITION

[75] Inventor: James F. Sproull, Sarver, Pa.

[73] Assignee: PPG Industries, Inc., Pittsburgh, Pa.

[21] Appl. No.: 621,830

[22] Filed: Jun. 18, 1984

Related U.S. Application Data

[63] Continuation-in-part of Ser. No. 562,945, Dec. 19, 1983, abandoned.

[51] Int. Cl.$^4$ .................. C03C 13/00; C03C 3/04
[52] U.S. Cl. ............................ 501/38; 501/70
[58] Field of Search ........................ 501/38, 70

[56] References Cited

U.S. PATENT DOCUMENTS

| | | | |
|---|---|---|---|
| 2,334,961 | 11/1943 | Schoenlaub | 501/35 |
| 2,571,074 | 10/1951 | Tiede et al. | 501/35 |
| 2,664,359 | 12/1953 | Dingledy | 501/38 |
| 3,095,311 | 6/1963 | von Wranau et al. | 501/38 |
| 3,847,626 | 11/1974 | Erickson et al. | 501/38 |
| 3,847,627 | 11/1974 | Erickson et al. | 501/38 |
| 3,876,481 | 4/1975 | Erickson et al. | 501/38 |
| 3,929,497 | 12/1975 | Clark-Monks | 501/38 |
| 4,026,715 | 5/1977 | Erickson et al. | 501/38 |
| 4,199,364 | 4/1980 | Neely | 501/35 |

*Primary Examiner*—Mark L. Bell
*Attorney, Agent, or Firm*—John E. Curley

[57] ABSTRACT

Novel glass fibers are described which contain 58 to 60 percent $SiO_2$, 11 to 13 percent $Al_2O_3$, 21 to 23 percent CaO, 2 to 4 percent MgO and 1 to 5 percent $TiO_2$. The fibers also have a seed count of 5 seeds or less per cc of glass and an electrical leakage value of 2.8 nanoamperes or less as measured by a test described in the specification.

3 Claims, No Drawings

FIBER GLASS COMPOSITION

This application is a continuation-in-part of my copending application Ser. No. 562,945, filed Dec. 19, 1983, now abandoned.

BACKGROUND OF THE INVENTION

In the manufacture of glass fibers it has been conventional to employ glass batch ingredients that contain boron and fluorine. These ingredients of glass batch act as fluxes during melting. Because the boron and fluorine constituents of a glass batch are volatilized during melting, varying quantities of boron and fluorine find their way from the furnace employed to the furnace stacks and ultimately the atmosphere. Since boron and fluorine are considered pollutants their emissions are controlled by environmental regulations which necessitates, in addition to careful control of furnace operations, the use of expensive and cumbersome pollution control equipment such as filters, scrubbers, electrostatic precipitators and the like, alone or in combination, to control their release to the atmosphere within the regulated values.

For these reasons, the art is constantly searching for glass batches which eliminate the use of boron or fluorine while still producing glass equivalent to or better in overall properties to the glasses made from glass batches using them.

Thus in U.S. Pat. No. 4,026,715 a silica, alumina and alkaline earth metal oxide glass composition is described which contains 2-4 percent by weight $TiO_2$. In addition, this glass composition also contains zirconium oxide.

U.S. Pat. No. 3,876,481 also describes a glass composition which contains $TiO_2$ in the range of 2-5 percent by weight as well as the silica, alumina and alkaline earth metal oxides normally employed in making a fiber glass composition. This composition also contains $Li_2O$ in varying concentrations.

U.S. Pat. No. 3,847,627 similarly discloses a glass composition containing in addition to the silica, alumina and alkaline earth metal constituents normal in a fiber glass composition, 2 to 4 percent titanium dioxide and 1 to 5.5 percent of an oxide of zirconia.

U.S. Pat. No. 3,929,497 is another boron free, fluorine free glass composition suitable for manufacturing fibrous glasses which contains titanium dioxide in the range of 0.5 percent to 5 percent by weight and $Fe_2O_3$ in quantities from 5 to 15 percent by weight.

Another glass composition known to the art that is boron free and fluorine free is described in U.S. Pat. No. 4,199,364. This composition contains $Li_2O$ in the range of 0.1 to 1.5 percent by weight in addition to the silica, alumina and alkaline earth metal oxides normally employed and may also employ quantities of barium oxide.

In U.S. Pat. No. 3,095,311 another glass fiber composition is described which in addition to silica, alumina and alkaline earth metal oxide contains titanium dioxide and must contain certain claimed quantities of lithium oxide.

In U.S. Pat. No. 3,847,626, a glass composition suitable for manufacturing glass fibers is disclosed which contains in addition to $SiO_2$, $Al_2O_3$ and alkaline earth metal oxides, titanium dioxide in quantities ranging from 3-5 percent by weight.

Glasses which are boron and fluorine free and which contain titanium dioxide in the higher level ranges, i.e., 2 percent and above, tend to have liquidus temperatures considerably greater than those, for example, found in a conventional fiber glass batch such as "621" glass described in U.S. Pat. No. 2,571,074 and "E" glass.

In addition to the above patents, Applicant is aware of one commercial glass fiber that contains in addition to $SiO_2$, $Al_2O_3$, CaO, MgO and $Na_2O$, a low $F_2$ content of 0.19 percent and $TiO_2$ in an amount ranging from 1.8 to 2.25 percent. Applicant is also aware of another commercial glass fiber which contains $TiO_2$ at a level of about 1.54 percent but which uses a boron level of about 0.47 percent and $F_2$ at about 0.14 percent.

While all of the above described glasses are fluorine free and boron free or contain a substantially reduced boron and fluorine content over conventional "E" glass, they are not ideal glasses for fiber formation for various reasons. Frequently, these glasses tend to have a liquidus temperature which is close to a temperature corresponding to a glass viscosity of log 3 (the lowest practical fiber forming viscosity) which renders their use in a glass fiber forming environment less than desirable.

Further tests conducted on the two known commercial glasses mentioned above show that their electrical leakage value measured in accordance with the test described hereinafter render them unsuitable as products in electrical applications or as reinforcements for electrical resin laminates such as used in circuit boards.

The standard glass fibers used in industry today for electrical applications are typically formed from "E" glass the composition of which is described in U.S. Pat. No. 2,334,961 and broadly is comprised of 52 to 56 $SiO_2$, 16 to 19 CaO, 3 to 6 MgO, 12 to 16 $Al_2O_3$, and 5 to 12 percent $B_2O_3$.

Another glass used for electrical applications is a modified "E" glass known as "621" glass and it is described in U.S. Pat. No. 2,571,074. This glass contains upwardly 52-56 percent $SiO_2$, 12 to 16 percent $Al_2O_3$, 19 to 25 percent CaO, and $B_2O_3$ and fluorspar combined, at 8 to 13 percent with the fluorospar being present up to 3 percent.

By virtue of the instant invention, Applicant has now discovered that $TiO_2$ containing glass fibers which are boron and fluorine free or which contain low boron and fluorine can be made such that they possess properties rendering them suitable as reinforcements in electrical applications. Applicant has found that by reducing seed counts in $TiO_2$ containing glass fibers to certain levels, acceptable fibers can be made for these electrical applications and the fibers will have electrical properties nearly equivalent to those found in fibers made from conventional "E" and "621" glasses.

Further in the preferred embodiment of the invention the Applicant has discovered glass fibers having a composition which is characterized by having excellent liquidus properties and viscosity properties rendering it ideal for glass fiber forming while eliminating the need for boron and fluorine as batch ingredients. The fibers formed from the preferred embodiment were found to possess electrical properties such that the fibers can be readily used as a replacement for the industry standard glasses, such as "E" and "621" glasses in electrical applications and possess enhanced tensile strengths over these standard glasses.

SUMMARY OF THE INVENTION

In general, the glass fibers of the instant invention consist essentially of 58% to 60% $SiO_2$, 11% to 13%

Al$_2$O$_3$, 21% to 23% CaO, 2% to 4% MgO and 1% to 5% TiO$_2$, all as percent by weight of the glass fiber composition. The glass fibers may also contain alkali metal oxide, sodium or potassium being preferred and calculated as sodium oxide. They are present at a level of up to 1% by weight of the glass fiber composition. The fibers are further characterized by having a seed count of 5 seeds or less per cc and an electrical current leakage value of 2.8 nanoamperes or less when subjected to the electrical leakage test herein described.

In the preferred embodiment of the instant invention the range of TiO$_2$ is between 1 and 1.8 with the other constituents and properties remaining in the ranges as stated above.

In the most preferred embodiment the glass fibers of the instant invention consists essentially of 59% SiO$_2$, 12.1% Al$_2$O$_3$, 22.6% CaO, 3.4% MgO and 1.5% TiO$_2$. This latter composition can also have present alkali metal oxide, preferably sodium oxide at 0.9%. Fibers of this composition are characterized by having an electrical leakage of 2.2 nanoamperes or less by the electrical leakage test herein described and a seed count of less than 5 seeds per cc of glass.

All of the above described glass fibers may also include in their composition Fe$_2$O$_3$ in trace quantities since it is normally introduced as an impurity in the SiO$_2$, Al$_2$O$_3$, and CaO batch materials. If present it is typically in the 0.2 to 0.3% range by weight of the composition.

The glass fibers of the instant invention are prepared in the conventional way by blending the raw materials used to supply the specific oxides that form the composition of the fiber. Thus, for example, sand is used for SiO$_2$, clay for Al$_2$O$_3$, lime or limestone for the CaO, dolomite for the MgO and some of the CaO, and TiO$_2$ can be supplied as pigment grade TiO$_2$ or as rutile, pigment grade TiO$_2$ being preferred.

After the ingredients are mixed in the proper quantities to provide the desired weight of each constituent for the desired glass, the batch is melted in a conventional fiber glass furnace and the resulting molten glass is passed along a conventional forehearth and into glass fiber forming bushings located along the bottom of the forehearth. The molten glass is drawn through a plurality of holes in the bottom of the bushing to form the glass fibers.

During the melting phase and in the melter the glass is typically heated to a temperature of at least 2550° F. To insure that the glass achieves the proper electrical leakage properties claimed, care must be exercised during melting to provide low seeds at the exit of the melter i.e., 10 to 12 seeds per cubic centimeter or less. If seeds in the glass melter are held to these values or less, it is found that the glass fibers formed from the TiO$_2$ containing glass melts, as calculated using the formula on pages 9 and 10 herein, will fall below 5 seeds per cubic centimeter of glass, and preferably 3 or less. Thus, the glasses of this invention, in addition to being free of fluorine and boron and having significant TiO$_2$ present, possess electrical leakage characteristics such that they can be used in lieu of the "E" and "621" glasses. These novel TiO$_2$ glasses also have better physical properties such as tensile strength than "E" or "621" glasses which also renders them attractive.

The glass seeds (which are defined herein for purposes of the specification and claims as a gaseous inclusion in glass in the molten or solid state) are generally controlled by the residence time of the batch ingredients circulating in the melter and the temperatures to which they are exposed over time. With the molten glass batch used to prepare the novel glass fibers of this invention it is important therefore to insure that the seed content of the formed fibers is held to a value of 5 or lower. This may be generally accomplished by maintaining a seed level in the melter at the exit zone for the molten glass passing from the melter in the range of 10 to 12 per cc or less since at these seed levels in the melter the fibers formed generally have a seed count of 5 or lower per cc of glass. Conventional furnace operating practices such as the use of bubblers, baffling and other means to promote glass circulation and residence time can be used. The temperatures can be regulated by the burners normally used in the fiber glass furnace to insure that the glass achieves the minimum temperature of 2550° F., preferably 2550° to 2650° F. In practice it is preferred that the molten glass leaving the melting chamber have been at a temperature of at least 2550° F. for at least 8 to 16 hours to achieve the proper seed values to produce the novel compositions of the instant invention. In the preferred operation electrically boosting the bottom glass in the melter with appropriate electrodes is the better way to insure that the glass reaches the 2550° F. temperature for the requisite time period. In any event when the seed content of the molten glass in the melter is at a level of 12 per cc or less at the exit by manipulation of the furnace process parameters of temperature and residence time the production of the novel glass fibers can proceed in a continuous manner with only periodic checks being made to insure that a consistent operation has been achieved.

Using the standard melting techniques referred to, a low TiO$_2$ glass batch, free of both fluorine and boron is melted and formed into fibers. The melter glass before exit to the refiner and associated forehearth is at 2550° F. and has been held at this temperature for an average of 8 to 16 hours. This glass at exit will have a seed count of about 12 seeds per cc. Fibers drawn from glass so formed typically will have a seed count of less than 5 seeds per cc and have the following chemical composition.

| Glass Composition | |
|---|---|
| Ingredients | % by Weight of Composition |
| SiO$_2$ | 59 |
| Al$_2$O$_3$ | 12.1 |
| Fe$_2$O$_3$ | 0.2 |
| CaO | 22.6 |
| MgO | 3.4 |
| Na$_2$O | 0.9 |
| TiO$_2$ | 1.5 |

Glass fibers having the above composition and seed count and the molten glass producing them were tested to determine various physical properties and typical values that were obtained are shown in Table I.

TABLE I

| Physical Properties | |
|---|---|
| Liquidus Temperature (°F.) | 2100 |
| Softening point °F. | 1646 |
| Refractive Index | 1.57 |
| Density | 2.67 |
| Temperature at Log 2 viscosity (°F.) | 2639 |
| Temperature at Log 3 viscosity (°F.) | 2281 |
| Tensile strength (psi) | 500,000 |

The properties obtained from the novel glass composition are excellent from a glass fiber forming standpoint since there is a 181° F. differential between the liquidus temperature and the temperature corresponding to a viscosity of Log 3.0. It is desirable to maintain a safe range between these two temperatures to avoid crystallization in the molten glass during the fiber drawing process. The preferred glass of the instant invention maintains this differential between liquidus temperature and temperature at Log 3 at 150° or higher. The softening point of this glass is measured typically at 1646° F. while previous measurements of a 621 glass indicate a 1545° F. softening point. The higher content $TiO_2$ containing fibers are, of course, less desirable in their liquidus-viscosity relationship than the preferred composition and therefore, require more control during forming.

Seed Count Test

Molten Glass

A sample of molten glass is taken from the melter exit by dipping a steel ladel into the molten glass at the exit. The molten glass is cooled in the ladel, the glass is removed, annealed, and cooled to room temperature. The glass is then cut into a one cubic centimeter sample volume and seeds are counted visually using an optical microscope.

Glass Fibers

A weighed sample of glass fibers to be tested is placed in a Pyrex, rectangular dish with all fibers extending lengthwise in the dish. The fibers are immersed in an oil having the same refractive index as the glass being tested. A focused light beam is used to strike the fibers perpendicular to the longitudinal axis of the fibers and the seeds in the fibers are counted. The seeds appear as a lighter color along a fiber, if present. These counted seeds are then calculated back to a seed concentration per unit volume using the following equation.

$$\frac{\text{Number of seeds counted}}{\text{Weight of glass tested}} \times \text{glass density} = \text{seeds per cc}$$

Using these methods of calculation, the novel glass compositions which are prepared as indicated above typically have seed contents of 5 or less per cc for fibers and as measured from molten glass from the melter of about 10 to 12 seeds per cc.

Electrical Leakage Test

The following procedure is used to test the glass compositions of the instant invention for their electrical leakage characteristics in a resin matrix.

A VICO ® single ring filament winding machine equipped with three (3) single ring mandrels and having winding tension control was used to prepare the test specimens. The machine used was from Vermont Instrument Company, Burlington, Vt.

A resin solution was prepared using 100 parts of Epon 828 epoxy resin (Shell Chemical) 85 parts Lindride-2, anhydride curing agent (Lindaw Chemical) and 3.6 parts of Accelerator D (Shell Chemical). The glass is tested in roving form and the rovings are passed through the bath at speeds to provide a resin pickup of between 28 to 33 percent and are wound on the three single ring mandrels to provide three filament wound fiber glass epoxy rings having 67 to 72% by weight glass. The resulting rings are cured while being rotated on a jig in a curing oven at 250°±9° F. for two hours.

The cured rings are then cut in half circle pieces for electrical current leakage testing. The ends of the half rings are dressed with fine sand paper to remove fuzz and filaments.

The three specimens are then conditioned for 16±0.5 hours at a relative humidity of 95 to 100 percent in a humidity chamber. The specimens are then removed and blotted to remove surface water and are tested immediately (within 5±2 minutes) for their electrical leakage properties.

An 1800 volt, 60 cycle AC power source is used and is connected to 100 volt, 60 cycle power supply. The specimens are placed in a caged safety enclosure. The power source switch is turned on to determine amperage leakage through air alone. The voltage is read in millivolts. A load of 1800 volts is applied to the rings tested from the power supply. The resistance of the ring being tested will permit a very small amperage flow (leakage) which flows through a 100,000 ohm shunt resistor in the power source. The voltage is read with a voltmeter across the resistor. With the known resistance and voltage, the leakage in amps is then determined using the $E = IR$ equation. The leakage obtained in the air alone test is subtracted from the net ring leakage to give the ring leakage and it is reported in nanoamperes ($1 \times 10^{-9}$ amp).

Novel glass fibers of this invention prepared as indicated above when subjected to the above electrical test have been found to have an electrical current leakage value of less than 2.8 nanoamperes. The two commercial glasses referred to on page 3 herein and containing $TiO_2$ when subjected to the above electrical test had current leakage values of 244 nanoamperes and 428 nanoamperes, both values being unacceptable as electrical circuit board reinforcement fibers. Fibers of these commercial glasses typically have seed values above 5 per cc and generally the seeds are in the range of 12 to 15.

Modifications to the compositions disclosed herein may be made without departing from the spirit of the invention. The important consideration in the composition disclosed and claimed is the maintenance of a low seed count fiber and the electrical properties claimed. Using the seed count as a guide, it is now possible to use $TiO_2$ in glass fibers at the claimed level to provide a fiber useful as support or reinforcement for electrical application. If in the higher ranges of $TiO_2$ the forming operation can be conducted so that the viscosity-liquidus relationship can be carefully controlled to prevent devitrification from occuring, useful fibers for electrical applications can be made. In the preferred embodiments, using $TiO_2$ in the 1 to 1.8 range, Applicant has found the viscosity-liquidus relationship to be more than adequate for glass forming and the low seed fibers to possess excellent electrical properties.

Thus, while the invention has been described with reference to certain specific embodiments, it is not intended to be limited thereby except in so far as appears in the accompanying claims.

I claim:

1. A glass fiber having a composition consisting essentially of 58 to 60 percent $SiO_2$, 11 to 13 percent $Al_2O_3$, 21 to 23 percent $CaO$, 2 to 4 percent $MgO$, 1 to 1.8 percent $TiO_2$, and alkali metal oxide selected from the group consisting of $Na_2O$ and $K_2O$ up to about 1 percent, all percentages by weight of the glass fiber composition and characterized by having a seed count of 5 seeds per cubic centimeter or less and an electrical current leakage value when measured by the electrical leakage test described herein of 2.8 nanoamperes or less.

2. The glass fibers of claim 1 wherein the $TiO_2$ is present at 1.5 percent.

3. A glass fiber composition consisting essentially of 59 percent $SiO_2$, 12.1 percent $Al_2O_3$, 22.6 percent CaO, 3.4 percent MgO, 1.5 percent $TiO_2$ and up to about 1 percent of an alkali metal oxide of the group consisting of $Na_2O$ and $K_2O$, all percents being by weight of the glass fiber composition, and wherein the fibers have a seed count of 5 seeds per cubic centimeter or less and an electrical current leakage when measured by the electrical leakage test herein of 2.2 nanometers or less.

* * * * *